United States Patent
Shukla et al.

(10) Patent No.: US 10,174,425 B2
(45) Date of Patent: Jan. 8, 2019

(54) NON-AQUEOUS COMPOSITIONS AND ARTICLES USING STANNOUS ALKOXIDES

(71) Applicant: Eastman Kodak Company, Rochester, NY (US)

(72) Inventors: Deepak Shukla, Webster, NY (US); Kevin M. Donovan, Bergen, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 572 days.

(21) Appl. No.: 14/860,762

(22) Filed: Sep. 22, 2015

(65) Prior Publication Data

US 2017/0081530 A1    Mar. 23, 2017

(51) Int. Cl.

| | |
|---|---|
| C23C 18/16 | (2006.01) |
| C08L 35/00 | (2006.01) |
| C09D 135/00 | (2006.01) |
| C08F 2/50 | (2006.01) |
| C08L 63/00 | (2006.01) |
| C09D 11/10 | (2014.01) |
| C09D 11/101 | (2014.01) |
| C09D 11/52 | (2014.01) |
| C08K 5/05 | (2006.01) |
| G03F 7/027 | (2006.01) |
| G03F 7/029 | (2006.01) |
| G03F 7/033 | (2006.01) |
| C09D 7/63 | (2018.01) |
| C08K 5/057 | (2006.01) |

(52) U.S. Cl.
CPC ............ *C23C 18/16* (2013.01); *C08F 2/50* (2013.01); *C08K 5/05* (2013.01); *C08L 35/00* (2013.01); *C08L 63/00* (2013.01); *C09D 7/63* (2018.01); *C09D 11/10* (2013.01); *C09D 11/101* (2013.01); *C09D 11/52* (2013.01); *C09D 135/00* (2013.01); *G03F 7/027* (2013.01); *G03F 7/029* (2013.01); *G03F 7/033* (2013.01); *C08K 5/057* (2013.01); *Y10T 428/24802* (2015.01)

(58) Field of Classification Search
CPC ....... C09D 11/10; C09D 11/101; C09D 11/52; Y10T 428/24802
See application file for complete search history.

(56) References Cited

U.S. PATENT DOCUMENTS

| | | | |
|---|---|---|---|
| 3,202,513 A | 8/1965 | Thommes | |
| 4,303,485 A | 12/1981 | Levensw | |
| 4,421,822 A | 12/1983 | Levens | |
| 5,039,783 A | 8/1991 | Brunelle | |
| 6,369,157 B1 * | 4/2002 | Winckler | B29C 67/246 264/257 |
| 6,390,636 B1 | 5/2002 | Takahagi et al. | |
| 7,682,774 B2 | 3/2010 | Kim et al. | |
| 7,875,416 B2 | 1/2011 | Park et al. | |
| 2007/0261595 A1 | 11/2007 | Johnson et al. | |
| 2014/0071356 A1 | 3/2014 | Petcavich | |
| 2015/0125596 A1 | 5/2015 | Ramakrishnan et al. | |

FOREIGN PATENT DOCUMENTS

| | | |
|---|---|---|
| WO | WO 2014/070131 | 5/2014 |
| WO | WO 2014/077785 | 5/2014 |

* cited by examiner

*Primary Examiner* — Gerard Higgins
(74) *Attorney, Agent, or Firm* — J. Lanny Tucker

(57) ABSTRACT

A non-aqueous stannous alkoxide composition comprises: component (a) comprising a water-insoluble stannous alkoxide complex comprising stannous ions in an amount of at least 1 weight %, and a photocurable component (b), non-photocurable water-insoluble polymer component (c) having a molecular weight of at least 10,000, or both the photocurable component (b) and the non-photocurable water-insoluble polymer component (c). When photocurable component (b) is present, the non-aqueous stannous alkoxide composition further comprises photosensitizer component (d) that is different from all of components (a) through (c), in an amount of at least 1 weight %. These compositions can be used to prepare silver particles as "seed" catalysts in various articles that can then be used for other purposes such as electroless plating.

11 Claims, No Drawings

NON-AQUEOUS COMPOSITIONS AND ARTICLES USING STANNOUS ALKOXIDES

RELATED APPLICATIONS

Reference is made to the following copending and commonly assigned patent application, the disclosure of which is incorporated herein by reference:

U.S. Ser. No. 14/860,754, (filed on Sep. 22, 2015, by Shukla and Donovan) that is entitled "Silver Formation Using Stannous Complexes."

FIELD OF THE INVENTION

This invention relates to non-aqueous metal catalytic compositions containing a stannous alkoxide complex and a photocurable component or a non-photocurable polymer. Such compositions can be used to provide silver particles in a coating or pattern of the non-aqueous metal catalytic composition. The resulting silver particles in the coating or pattern can be used directly as electrically-conductive materials or as "seed" catalytic sites for electroless plating of a suitable electrically-conductive metal. Various articles can be used or formed in this invention.

BACKGROUND OF THE INVENTION

Rapid advances are occurring for making and using various electronic devices especially display devices that are used for various communication, financial, and archival purposes. For such uses as touch screen panels, electrochromic devices, light emitting diodes, field effect transistors, and liquid crystal displays, electrically-conductive films are essential and considerable efforts are being made in the industry to improve the properties of those electrically-conductive films.

There is a particular need to provide touch screen displays and devices that contain improved electrically-conductive film elements. Currently, touch screen displays use Indium Tin Oxide (ITO) coatings to create arrays of capacitive areas used to distinguish multiple point contacts. ITO coatings have significant short comings. Indium is an expensive rare earth metal and is available in limited supply from very few sources in the world. ITO conductivity is relatively low and requires short line lengths to achieve adequate response rates. Touch screens for large displays are broken up into smaller segments to reduce the electrically-conductive line length to an acceptable resistance. These smaller segments require additional driving and sensing electronics. In addition ITO is a ceramic material, is not readily bent or flexed, and requires vacuum deposition with high processing temperatures to prepare the electrically-conductive layers.

Silver is an ideal electrical conductor having electrical conductivity of 50 to 100 times greater than ITO. Silver is thus used in many commercial applications and is available from a number of sources. It is highly desirable to make electrically-conductive film elements using silver as the source of electrical conductivity.

Numerous publications describe the preparation of electrically-conductive films formed by reducing a silver halide image in silver halide emulsions in the form of electrically-conductive grid networks having silver wires having sizes of less than 10 µm. Various efforts have been made to design the silver halide emulsions and processing conditions to optimize such electrically-conductive grid networks and the methods for making them.

For example, improvements have been proposed for providing electrically-conductive grid patterns from silver halides by optimizing the silver halide emulsions as well as finding optimized processing solutions and conditions to convert latent silver images into silver metal grid patterns. The precursors used to provide the electrically-conductive grid patterns can comprise one or more silver halide emulsion layers on opposing sides of a transparent substrate.

While these processes and articles can provide desired electrically-conductive films, optimizing the design of both the precursors and processing procedures requires considerable effort in order to achieve the exacting features required in electrically-conductive films to be incorporated into touch screen displays.

Other industrial approaches to preparing electrically-conductive films or elements have been directed to formulating and applying photocurable compositions containing dispersions of metal particles such as silver metal particles to substrates, followed by curing the photocurable components in the photocurable compositions. The applied silver particles thus act as catalytic (seed) particles for electrolessly plated electrically-conductive metals. Useful electrically-conductive grids prepared in this manner are described for example in U.S. Patent Application Publications 2014/0071356 (Petcavich) and 2015/0125596 (Ramakrishnan et al.). Other details of a useful manufacturing system for preparing conductive articles especially in a roll-to-roll manner are provided in WO 2014/070131 (Petcavich et al.).

Using these known methods and photocurable compositions containing silver particles can be printed and cured on suitable transparent substrates for example, a continuous roll of transparent and flexible polyester film and then carrying out electroless plating. However, these methods require high quantities of silver particles dispersed within the photocurable compositions in a uniform manner so that coatings or printed patterns have sufficiently high concentration of seed catalytic sites. Generally, this cannot be achieved without carefully designed dispersants that can be expensive to make or purchase and tedious or difficult to use to provide sufficient reproducibility in a high speed manufacturing operation. Without effective dispersing, silver particles can readily agglomerate in the curable compositions, leading to less effective and uniform catalytic metal patterns and electroless plating. The resulting electrically-conductive films or elements would lack the desired electrical conductivity or durability, or both.

U.S. Patent Application Publication 2007/0261595 (Johnson et al.) describes a method for electroless deposition on a substrate that uses an ink composition containing silver as a reducible silver salt and filler particles.

U.S. Pat. No. 7,682,774 (Kim et al.) describes photosensitive compositions comprising silver fluoride organic complex precursors as catalyst precursors as well as a polymer derived from a monomer having a carboxyl group and a co-polymerizable monomer.

Stannous (II) salts are effective reducing agents for silver and silver mirrors are routinely produced on glass surfaces using stannous chloride as sensitizer (see *Chem. Educ.* 2011, 88, 274-275 and *J. Aus. Cer. Soc.* 2013, 49, 62-69).

U.S. Pat. No. 3,202,513 (Thommes) describes the use of water-soluble stannous salts such as stannous chloride, stannous palmitate, and stannous chloride in photopolymerizable compositions that are stated to be useful in the preparation of printing relief elements and printed circuits.

U.S. Pat. No. 6,390,636 (Takahagi et al.) describes the use of aqueous hydrochloric acid solution of stannous chloride and palladium chloride as activating treatment agent to form silver mirrors.

Electroless plating had been used for a long time as an industrial process to provide conductive or decorative coatings on surfaces. Before electroless plating, a palladium (Pd) activation step that introduces the catalytic sites onto the surface had to be carried out. The conventional method of surface catalysis involved immersion of the surface in a sensitizing solution containing $SnCl_2$/HCl solution followed by immersion in activating solution containing $PdCl_2$/HCl solution. This induces a redox reaction whereby $Sn^{2+}$ is oxidized to $Sn^{4+}$ and $Pd^{2+}$ is reduced to Pd(0). This Pd(0) is an active catalyst for electroless deposition of metals. This conventional "two-step" activation process in some cases has been replaced by "one-step" process that uses a colloidal mixture of $SnCl_2$ and $PdCl_2$ (see Lee et al. *Latest Trends in Environmental and Manufacturing Engineering*). The particle size of the palladium colloid thus formed is around 1-2 nm. Growth beyond that point is limited by the spontaneous formation of a tin chloride shell around each palladium particle, which must be removed as this shell inhibits growth of metal deposit.

Stannous chloride activation is also used in the manufacture of printed circuits. This manufacturing process utilizes an electroless metal deposit on a dielectric substrate either as a uniform surface coating or in a predetermined pattern. This initial electroless deposit is usually thin and is further built up by electroplating. The usual process for achieving the electroless metal coating on non-conductive or semi-conductive substrates such as polymeric films comprises treating the surface by immersion in a bath containing stannous chloride or another stannous salt; seeding or catalyzing to provide catalytic nucleating centers by immersion in a salt of a metal catalytic to the deposition of the desired metal coating such as silver nitrate or the chlorides of gold, palladium, or platinum, these metal ions being reduced to catalytic metal nucleating centers by the stannous ions adsorbed on the substrate or by reducing agents contained in the electroless metal deposition bath; and thereafter depositing the desired metal, such as copper, nickel, or cobalt by treating the catalyzed surface with a salt of the desired metal plus a reducing agent therefor.

As described above, the effective solutions for catalytic sensitization of the surface requires mixing a palladium salt, such as palladium chloride, and a tin salt such as stannous chloride in aqueous hydrochloric acid. These methods or materials are not suitable for coating or flexographic printing processes especially in high speed roll-to-roll manufacturing operations.

Advances in the art are provided using various reducible silver complexes have been designed so that upon reduction, the resulting silver metal provides catalytic sites for electroless plating. For example, non-aqueous metal catalytic compositions have been designed to include suitable silver complexes containing reducible silver ions and silver ion reducing components.

There is a further need to provide additional improvements by improving the generation of catalytic silver particles.

SUMMARY OF THE INVENTION

To address these problems, the present invention provides a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

Such compositions can be used to provide a precursor article comprising a substrate and having disposed on at least one supporting surface thereof, a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photo sensitizer component (d) that is different from all of components (a) through (c), in an amount of at least 1 weight %, based on the total weight of the non-aqueous stannous alkoxide composition.

The present invention further comprises an intermediate article comprising a substrate and having disposed on at least one supporting surface thereof, a water-insoluble photocured stannous alkoxide-containing pattern that was derived from photocuring a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

In addition, another intermediate article of the present invention comprises a substrate and having disposed on at least one supporting surface thereof, a water-insoluble photocured pattern comprising silver (0) particles on the surface of a water-insoluble photocured stannous alkoxide-containing composition that was derived by photocuring a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

Still again, the present invention provides a product article comprising a substrate and having disposed on at least one supporting surface thereof, an electrically-conductive pattern comprising an electrically-conductive metal other than silver, which electrically-conductive pattern corresponds to and is electrically-plated over a water-insoluble photocured pattern comprising silver (0) particles on the surface of a water-insoluble stannous alkoxide-containing pattern that was derived by photocuring a non-aqueous stannous alkoxide composition that comprises the following components:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

An advantage of the present invention is to provide a source of silver particles that can be used as electrically-conductive silver metal or catalytic (seed) sites for electroless plating without having to disperse silver particles in various photocurable compositions. The present invention avoids the need to carefully disperse silver particles and potential agglomeration in coating or printing compositions ("inks") by "creating" or generating the silver particles in-situ at or near the surface as seed catalysts after a composition (photocurable or not) has been coated or printed. Thus, the silver particles are generated in situ from reducible silver ions that can be provided in silver alkoxide complexes in coated or printed non-aqueous metal catalytic compositions. Using this means for producing silver metal particles reduces possible operator errors during dispersing processes and reduces defects in producing electrically-conductive patterns. These advantages are particularly useful in high-speed manufacturing operations such as roll-to-roll methods in which the application, curing, and electroless plating can be carried out in a continuous manner.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any specific embodiment.

Definitions

As used herein to define various components of the non-aqueous composition, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary or have customary or commonly understood meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a non-aqueous stannous alkoxide composition, its formulation, or the percentage of the dry weight of a stannous alkoxide-containing catalytic layer or catalytic pattern. Unless otherwise indicated, the percentages can be the same for either a dry stannous alkoxide-containing catalytic layer or catalytic pattern, or for the total solids of the non-aqueous stannous alkoxide composition used to make such catalytic layers or catalytic patterns.

As used herein, the terms "curing" and "photocuring" mean the polymerization of functional oligomers and monomers, or even polymers, into a crosslinked polymer network as initiated by suitable irradiation. Curing can be polymerization of unsaturated monomers or oligomers as photocurable components in the presence of crosslinking agents.

The non-aqueous stannous alkoxide composition described herein that contain photocurable components can be photosensitive (for example, photocurable) when irradiated with suitable radiation, for example ultraviolet (UV) or visible radiation having a wavelength of at least 150 nm and up to and including 750 nm and particularly in the UV region of the electromagnetic spectrum having a wavelength of at least 150 nm and up to and including 410 nm. In some embodiments, the non-aqueous composition is sensitive at multiple wavelengths in the noted ranges, and for example, can be sensitive both in the UV region as noted as well as in the visible region having a wavelength of greater than 410 nm and up to and including 750 nm.

Unless otherwise indicated, the term "non-aqueous" as applied to the non-aqueous stannous alkoxide composition means that liquids in such compositions are predominantly organic solvents or essential components (described below) and water is not purposely added and may be present in an amount of less than 10 weight %, or particular of less than 5 weight %, or even less than 1 weight %, based on the total non-aqueous stannous alkoxide composition weight. In most instances, the presence of water can adversely affect the silver particles generated in the practice of the present invention.

Average dry thickness of silver catalytic layers or silver catalytic patterns described herein can be the average of at least 2 separate measurements taken, for example, using electron microscopy.

Unless otherwise indicated herein, the terms "transparent" or "transparency" refer to a material (single layer or structure with multiple layers) having an integrated transmittance over the noted range of electromagnetic spectrum (for example 410 nm to 700 nm) of at least 80%, or even of at least 90%, as measured using a spectrophotometer and known techniques.

Similarly, the average dry thickness or width of lines, grid lines, or other pattern features described herein can be the average of at least 2 separate measurements taken, for example, using electron microscopy.

Unless otherwise indicated, the terms "supporting side" and "supporting surface" in reference to a top or bottom planar surface of a substrate, are meant to refer to the same substrate feature.

Unless otherwise indicated, the term "group" particularly when used to define a substituent of a define moiety, can itself be substituted or unsubstituted (for example and alkyl group" refers to a substituted or unsubstituted alkyl). Generally, unless otherwise specifically stated, substituents on any "groups" referenced herein or where something is stated to be possibly substituted, include the possibility of any groups, whether substituted or unsubstituted, which do not destroy properties necessary for the utility of the component or non-aqueous metal catalytic composition. It will also be understood for this disclosure and claims that reference to a compound of a particular general structure includes those compounds of other more specific formula that fall within the general structural definition. Examples of substituents on any of the mentioned groups can include known substituents such as: halogen (for example, chloro, fluoro, bromo, and iodo); alkoxy particularly those with 1 to 12 carbon atoms (for example, methoxy and ethoxy); substituted or unsubstituted alkyl groups, particularly lower alkyl groups (for example, methyl and trifluoromethyl); alkenyl or thioalkyl (for example, methylthio and ethylthio), particularly either of those with 1 to 12 carbon atoms; substituted and unsubstituted aryl, particularly those having from 6 to 20 carbon atoms in the aromatic ring (for example, phenyl); and substituted or unsubstituted heteroaryl, particularly those having a 5- or 6-membered ring containing 1 to 3 heteroatoms selected from N, O, S or Se (for example, pyridyl, thienyl, furyl, pyrrolyl, and their corresponding benzo and naptho analogs); and other substituents that would be readily apparent in the art. Alkyl substituents particularly contain 1 to 12 carbon atoms and specifically include "lower alkyl" that is having from 1 to 6 carbon atoms, for example, methyl, ethyl, and t-butyl. Further, with regard to any alkyl group, alkylene group or alkenyl group, it will be understood that these can be branched or unbranched and include ring (cyclic) structures.

Unless otherwise indicated, molecular weight values ($M_w$) described herein are obtained from literature sources or by measuring the values using standard equipment and procedures. For example, $M_w$ can be determined using Size Exclusion Chromatography (SEC) and values are reported herein as poly(methyl methacrylate) equivalent weights.

Uses

The water-insoluble stannous alkoxide complexes and compositions described herein can be used for a variety of purposes where efficient photocuring or photopolymerization is needed to provide various articles or devices. The photocurable water-insoluble stannous alkoxide compositions described herein are sensitive to a chosen radiation wavelength as noted above. For example, the present invention can be used to provide electrically-conductive articles, for example using electroless plating procedures that can be incorporated into various devices including but not limited to touch screen or other transparent display devices that can be used in numerous industrial and commercial products.

For example, touch screen technology can comprise different touch sensor configurations including capacitive and resistive touch sensors that are useful in various devices. These electronic devices can include but are not limited to, televisions, monitors, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process where micro electrically-conductive features can be created in a single pass are possible using the present invention. The water-insoluble stannous alkoxide compositions described herein can be used in such systems and methods by application with relief printing members such as flexographic printing plates having suitable relief patterns for printing. Multiple patterns can be printed on one or both supporting sides of a substrate as described in more detail below. For example, one predetermined pattern can be printed on one supporting side of the substrate and a different predetermined pattern can be printed on the opposing second supporting side of the substrate. The printed patterns can then be further processed to provide electrically-conductive metal patterns for example using electroless metal plating.

Non-Aqueous Stannous Alkoxide Compositions

In general, many embodiments of the non-aqueous stannous (II) alkoxide compositions described herein containing photocurable component (b) described below are sensitive throughout the UV to visible spectral region as described above and are photocurable without appreciable application of heat. Photocuring can occur at essentially room temperature (for example, as low as 18° C.) when all of the required components of the non-aqueous stannous alkoxide compositions are properly mixed together. Other embodiments of the non-aqueous stannous alkoxide compositions containing non-photocurable water-insoluble polymer component (c) but no photocurable component (b) are not photocurable for reasons described below.

The non-aqueous stannous alkoxide compositions described herein are designed to be effective when they comprise at least essential component (a) described herein, and either photocurable component (b) or non-photocurable water-insoluble polymer component (c), or both photocurable component (b) and non-photocurable water-insoluble polymer component (c). Such components are the only components necessary to achieve the desired of silver ion reduction to silver metal. Optional addenda can also be included as described below but such optional addenda are not essential to obtain the required properties from the practice of the invention and can be omitted if desired.

The essential component (a) comprises a water-insoluble stannous alkoxide complex that is present in an amount of at least 1 weight %, or at least 3 weight % and up to and including 30 weight %, or even at least 5 weight % and up to and including 15 weight %, based on the total weight of the non-aqueous stannous alkoxide composition (including water, all essential components, and any optional addenda). Two or more water-insoluble stannous alkoxide complexes can be used in component (a) if desired.

The essential water-insoluble stannous alkoxide complex comprises stannous (II) ions. Such stannous complexes are generally non-polymeric in nature (meaning that the complex molecular weight is less than or equal to 3,000 or even less than or equal to 1000, as determined using known processes). However, polymeric stannous alkoxide complexes are also useful in the present invention where the water-insoluble stannous alkoxide complex is covalently attached to a polymeric backbone in a suitable manner. Water-insoluble stannous alkoxide complexes can be prepared by reacting anhydrous stannous chloride ($SnCl_2$) in an appropriate alcohol (see for example, *Inorg. Chem.*, 1978, 17, 501; and *J. Inorg. Nucl. Chem.*, 1975, 37, 1133.).

Some particularly useful water-insoluble stannous alkoxide complexes are represented by the following Structure (I):

$$R_1O\text{—}Sn\text{—}OR_2 \qquad (I)$$

wherein $R_1$ and $R_2$ are independently substituted or unsubstituted alkyl groups (linear, branched, or cyclic such as cycloalkyl), each independently having 1 to 12 carbon atoms, including but not limited to, methyl, ethyl, isopropyl, t-butyl, n-hexyl, iso-octyl, decyl, and dodecyl groups, cyclohexyl, and cyclooctyl groups. Such alkyl groups can be have one or more substituents that will not adversely affect the ability of the water-insoluble stannous alkoxide complex to reduce the reducible silver ions. In some embodiments, the $R_1$ and $R_2$ groups independently have 3 to 8 carbon atoms in the linear, branched or cyclic alkyl groups.

It is desirable to use liquid water-insoluble stannous alkoxide complexes that are soluble in inert organic solvents at room temperature such as but not limited to, inert organic solvents described below for the non-aqueous stannous alkoxide compositions, including but not limited to 1-methoxy ethanol, 1-methoxy-2-propanol, acetonitrile, tetrahydrofuran, anisole, methyl ethyl ketone, cyclohexanone, hexanone, ethyl acetate, propyl acetate, and mixtures thereof. The specific water-insoluble stannous alkoxide complex and organic solvent can be matched to have optimal properties. Most water-insoluble stannous alkoxides defined by Structure (I) above wherein $R_1$ and $R_2$ are independently linear $C_1$-$C_4$ alkyl groups are white solids and may not be soluble in inert organic solvents in the temperature range of 25-35° C. However, as disclosed in WO 2014/077785 A1 (Meepowpan), whether the water-insoluble stannous alkoxide complex is isolated as a solid or as an oil largely depends on its self-aggregation and the synthetic process used to make these materials. Accordingly, WO 2014/077785 A1 (noted above) describes an improved method to make water-insoluble (inert organic solvent soluble) stannous alkoxide complexes.

The water-insoluble stannous alkoxide complexes used in the present invention can be at least partially soluble in the inert organic solvents that can be present in the non-aqueous stannous alkoxide compositions as described below in order to achieve dispersion of all components.

In some embodiments, when photocurable component (b) is present in the non-aqueous stannous alkoxide composition, the water-insoluble stannous alkoxide complex can be covalently attached to a free radically photocurable material that can be the same as or different from the photocurable component (b). In such embodiments, the water-insoluble stannous alkoxide complex bears suitable ethylenically unsaturated moieties such as for example, hydroxyethyl methacrylate (HEMA) to attach it to free radically photocurable material in photocurable component (b).

As noted above, each non-aqueous stannous alkoxide composition used in the present invention comprises at least photocurable component (b) or non-photocurable water-insoluble polymer component (c), or both photocurable component (b) and non-photocurable water-insoluble polymer component (c), along with the water-insoluble stannous alkoxide complex in component (a).

Thus, in some embodiments, the non-aqueous stannous alkoxide composition consists essentially of component (a) as defined above and photocurable component (b) as defined below, but no non-photocurable water-insoluble polymer component (c) as defined below, and optionally an inert organic solvent as described below.

In other embodiments, the non-aqueous stannous alkoxide composition consists essentially of a water-insoluble stannous alkoxide complex of component (a) and photocurable component (b) comprising a material that also acts as an organic solvent for the non-aqueous stannous alkoxide composition and no inert solvents are purposely added to the non-aqueous stannous alkoxide composition.

In yet other embodiments, the non-aqueous stannous alkoxide composition consists essentially of a water-insoluble stannous alkoxide of component (a) and a non-photocurable water-insoluble polymer component (c) but no photocurable component (b), and optionally an inert organic solvent as described below.

In still other useful embodiments, the non-aqueous stannous alkoxide composition consists essentially of a water-insoluble stannous alkoxide of component (a), photocurable component (b), and non-photocurable water-insoluble polymer component (c), and optionally an inert organic solvent as described below.

Some of the non-aqueous stannous alkoxide compositions comprise a photocurable component (b) that can comprise a photocurable material that can be photocured to form a water-insoluble binder matrix. Photocurable component (b) can include a combination of one or more free radical photoinitiators, one or more free radically photocurable materials. Photocurable component (b) does not comprise non-photocurable, water-insoluble polymer materials that are present in component (c). Mixtures of photocurable materials can be present in photocurable component (b).

Overall, photocurable component (b) can be present in the non-aqueous stannous alkoxide composition in an amount of at least 10 weight % and up to and including 75 weight %, and typically in an amount of at least 10 weight % and up to and including 50 weight %, all based on the total weight of the non-aqueous stannous alkoxide composition. The amounts of each of photocurable components (b) and non-photocurable water-insoluble polymer component (c) can be adjusted depending upon what each component is designed to do. The amounts of each component can also be adjusted when there are multiple materials comprising the photocurable component (b), such as one or more free radically photocurable monomers, one or more free radically photocurable oligomers, or one or more free radically photocurable polymers as well as free radical photoinitiators that can be used with such materials. Useful photocurable materials are those that can participate in a photocuring reaction under conditions described below. Such free radically photocurable materials are chosen to participate in free radical photocuring in which free radicals are generated upon photoexposure.

In general, the free radically photocurable materials are sensitive throughout the UV to visible spectral region as described above and are photocurable or cause photocuring in these electromagnetic regions under suitable conditions. Thus, photocuring or photopolymerization can occur at essentially room temperature (for example, as low as 18° C.) or higher when all of the materials are properly mixed together.

For free radical photocuring chemistry, the free radically photocurable material can be one or more free-radically polymerizable compounds having free-radically polymerizable functionality, including ethylenically unsaturated polymerizable monomers, oligomers, or polymers such as mono-functional or multi-functional acrylates (also includes methacrylates). Such free-radically photocurable materials comprise at least one ethylenically unsaturated polymerizable bond and they can comprise two or more of these unsaturated moieties in many embodiments. Suitable materials of this type contain at least one ethylenically unsaturated polymerizable bond and are capable of undergoing addition (or free radical) polymerization. Such free radically polymerizable materials include mono-, di-, or poly-acrylates and methacrylates, co-polymerizable mixtures of acrylate monomers and acrylate oligomers, and vinyl compounds such as styrene and styrene derivatives, diallyl phthalate, divinyl succinate, divinyl adipate, and divinyl phthalate. Mixtures of two or more of these free radically polymerizable materials can be used if desired. Such materials can be purchased from a number of commercial sources or prepared using known synthetic methods and starting materials.

One or more free radically photocurable materials can be present in the non-aqueous stannous alkoxide compositions in an amount of at least 10 weight % and up to and including 60 weight %, based on the total weight of the non-aqueous stannous alkoxide composition.

Photocurable component (b) also includes one or more free radical photoinitiators that are also present to generate free radicals in the presence of the free-radically photocurable materials. Such free radical photoinitiators include any compound that is capable of generating free radicals upon exposure to photocuring radiation used in the practice of this invention. For example, free radical photoinitiators can be selected from triazine compounds, thioxantone compounds, benzoin compounds, carbazole compounds, diketone compounds, sulfonium borate compounds, diazo compounds, and biimidazole compounds, benzophenone compounds, anthraquinone compounds, acetophenone compounds, and others that would be readily apparent to one skilled in the art. Mixtures of such free radical photoinitiators can be selected from the same or different classes. Many of such free radical photoinitiators can be obtained from various commercial sources.

Such free radical photoinitiators can be present in the non-aqueous stannous alkoxide composition in an amount of at least 0.1 weight % and up to and including 10 weight %, or typically in an amount of at least 1 weight % and up to and including 5 weight %, all based on the total weight of the non-aqueous stannous alkoxide composition.

It is also possible but not essential that the non-aqueous stannous alkoxide compositions comprise photocurable components that participate in acid-catalyzed photocuring including photopolymerizable epoxy materials that are organic compounds having at least one oxirane ring that is polymerizable by a ring opening mechanism. Such epoxy materials, also called "epoxides", include monomeric epoxy compounds and epoxides of the polymeric type and can be aliphatic, cycloaliphatic, aromatic or heterocyclic. These materials generally have, on the average, at least one polymerizable epoxy group per molecule, or typically at least about 1.5 and even at least about 2 polymerizable epoxy groups per molecule. Polymeric epoxy materials include linear polymers having terminal epoxy groups (for example, a diglycidyl ether of a polyoxyalkylene glycol), polymers having skeletal (backbone) oxirane units (for example, polybutadiene polyepoxide), and polymers having pendant epoxy groups (for example, a glycidyl methacrylate polymer or copolymer).

The epoxy materials can vary from low molecular weight monomeric materials to high molecular weight polymers and they can vary greatly in the nature of the backbone and substituent (or pendant) groups. For example, the backbone can be of any type and substituent groups thereon can be any group that does not substantially interfere with cationic photocuring process desired at room temperature. The molecular weight of the epoxy materials can be at least 58 and up to and including 100,000, or even higher.

Specific useful epoxy materials would be readily apparent to one skilled in the art. Many commercially available epoxy materials are useful in the present invention, glycidyl ethers such as bisphenol-A-diglycidyl ether (DGEBA), glycidyl ethers of bisphenol S and bisphenol F, butanediol diglycidyl ether, bisphenol-A-extended glycidyl ethers, phenol-formaldehyde glycidyl ethers (epoxy novolacs) and cresol-formaldehyde glycidyl ethers (epoxy cresol novolacs), epoxidized alkenes such as 1,2-epoxyoctane, 1,2,13,14-tetradecane diepoxide, 1,2,7,8-octane diepoxide, octadecylene oxide, epichlorohydrin, styrene oxide, vinyl cyclohexene oxicyclohexene oxide, glycidol, glycidyl methacrylate, diglycidyl ether of Bisphenol A, vinyl cyclohexene dioxide, 3,4-epoxycyclohexylmethyl-3,4-epoxycyclohexene carboxylate, 3,4-epoxy-6-methylcyclohexylmethyl-3,4-epoxy-6-methyl-cyclohexene carboxylate, bis(3,4-epoxy-6-methylcyclohexylmethyl) adipate, bis(2,3-epoxy-cyclopentyl) ether, aliphatic epoxy modified with polypropylene glycol, dipentene dioxide, epoxidized polybutadiene, silicone resin containing epoxy functionality, flame retardant epoxy resins, 1,4-butanediol diglycidyl ether of phenol formaldehyde novolak, resorcinol diglycidyl ether, 2-(3,4-epoxycyclohexyl-5,5-spiro-3,4-epoxy)cyclohexane-meta-dioxane, 2-(3,4-epoxycyclohexyl-5,5-spiro-3,4-epoxy)cyclohexane-meta-dioxane, vinyl cyclohexene monoxide, 1,2-epoxyhexadecane, alkyl glycidyl ethers, butyl glycidyl ether, cresyl glycidyl ether, p-tert butylphenyl glycidyl ether, polyfunctional glycidyl ethers such as diglycidyl ether of 1,4-butanediol, diglycidyl ether of neopentyl glycol, diglycidyl ether of cyclohexanedimethanol, trimethylol ethane triglycidyl ether, trimethylol propane triglycidyl ether, polyglycidyl ether of an aliphatic polyol, polyglycol diepoxide, bisphenol F epoxides, and 9,9-bis>4-(2,3-epoxypropoxy)-phenyl fluorenone.

Still other useful epoxy materials are resins such as copolymers derived from acrylic acid esters reacted with glycidol such as glycidyl acrylate and glycidyl methacrylate, copolymerized with one or more ethylenically unsaturated polymerizable monomers.

Various compounds can be used to generate a suitable acid to participate in the photocuring of the photopolymerizable epoxy materials described above. Some of these "photoacid generators" are acidic in nature and others are nonionic in nature. Other useful photoacid generators besides those described below would be readily apparent to one skilled in the art in view of the teaching provided herein.

Onium salt acid generators useful in the practice of this invention include but are not limited to, salts of diazonium, phosphonium, iodonium, or sulfonium salts including polyaryl diazonium, phosphonium, iodonium, and sulfonium salts. The iodonium or sulfonium salts include but not limited to, diaryliodonium and triarylsulfonium salts. Useful counter anions include but are not limited to complex metal halides, such as tetrafluoroborate, hexafluoroantimonate, trifluoromethanesulfonate, hexafluoroarsenate, hexafluorophosphate, and arenesulfonate. The onium salts can also be oligomeric or polymeric compounds having multiple onium salt moieties as well as molecules having a single onium salt moiety.

Besides onium salts described above, nonionic photoacid generators can be useful, which compounds include but are not limited to, diazomethane derivatives such as, glyoxime derivatives, bissulfone derivatives, disulfono derivatives, nitrobenzyl sulfonate derivatives, sulfonic acid ester derivatives, and sulfonic acid esters of N-hydroxyimides.

Non-photocurable water-insoluble polymer component (c) comprises one or more non-photocurable, water-insoluble polymeric materials that can act as binder materials or if in liquid form, as organic solvents for the non-aqueous stannous alkoxide composition. Examples of such non-photocurable, water-insoluble polymer component (c) materials include but are not limited to polyalkyl methacrylates, poly(vinyl acetate), polystyrene, poly(vinyl alcohol), polypropylene, poly(vinyl butyral) (for example, BUTVAR™ resin) and other polyvinyl acetals, and other polymers that would be readily apparent to one skilled in the art from this teaching. They can also include copolymers derived at least in part from vinyl alcohol or derivatives thereof. Each of such non-photocurable, water-insoluble polymer component (c) materials generally has a molecular weight of at least 10,000 and more likely of at least 10,000 and up to and including 200,000.

When photocurable component (b) is present within the non-aqueous stannous alkoxide compositions, such compositions can also include one or more photosensitizer component (d) that is different from all of components (a) through (c) materials. Such photosensitizer component (d) can including one or more electron donor photosensitizers. In general, many different classes of compounds can be used as electron donor photosensitizers including but are not limited to, aromatics such as naphthalene, 1-methylnaphthalene, anthracene, 9,10-dimethoxyanthracene, benz[a]anthracene, pyrene, phenanthrene, benzo[c]phenanthrene, and fluoranthene; thioxanthones and xanthones; ketones including aromatic ketones such as fluorenone, and coumarin dyes such as ketocoumarins such as those with strong electron donating moieties (such as dialkylamino). Other suitable electron donor photosensitizers include xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriarylmethanes, merocyanines, squarylium dyes, and pyridinium dyes.

In some embodiments, the electron donor photosensitizer is a pyrene, benzopyrene, perylene, or benzoperylene. In other embodiments, useful photosensitizers include but are not limited to, xanthones, thioxanthones, and arylketones.

The one or more photosensitizers of component (d) can be present in the non-aqueous stannous alkoxide composition in an amount of at least 1 weight % and up to and including 5 weight %, and typically in an amount of at least 1 weight % and up to and including 4 weight %, based on the total weight of the non-aqueous stannous alkoxide composition.

The non-aqueous stannous alkoxide compositions are generally prepared for coating, printing, or other means of application by simply admixing, under "safe light" conditions, the essential water-insoluble stannous complex of component (a) and photocurable component (b); water-insoluble stannous complex of component (a) and non-photocurable water-insoluble polymer component (c); or all of water-insoluble stannous alkoxide of component (a), photocurable component (b), and non-photocurable water-insoluble polymer component (c), and each mixture further including any optional but non-essential materials described herein. All materials can be mixed and dispersed within suitable inert organic solvents as described below.

In some embodiments, one or more of the materials of photocurable component (b) or non-photocurable water-insoluble polymer component (c) act as an organic solvent medium and no additional inert organic solvents are purposely added to the non-aqueous stannous alkoxide composition.

The non-aqueous stannous alkoxide composition can further include carbon black, graphite, graphene, carbon nanotubes, or other sources of carbon if desired in an amount of at least 0.5 weight % and up to and including 10 weight %, based on the total weight of the non-aqueous stannous alkoxide composition.

It is also possible to include carbon-coated metal particles such as carbon-coated copper particles or carbon-coated silver particles in at an amount of at least 0.5 weight % based on the total weight of non-aqueous stannous alkoxide composition.

The non-aqueous stannous alkoxide compositions can also contain suitable adjuvants (or additives) such as accelerators, inhibitors, absorbers, stabilizers, pigments, dyes, UV absorbers, viscosity modifiers, flow improvers, surface tension depressants and wetting aids, antioxidants, and surfactants as long as the desired characteristics of the non-aqueous stannous alkoxide compositions are not lost or severely diminished.

Preparing Non-Aqueous Stannous Alkoxide Compositions

The non-aqueous stannous alkoxide compositions are generally prepared for coating, printing, or other means of application by simply admixing, under "safe light" conditions (if appropriate), the various essential components (described above) and any optional components described above. Such materials can be mixed and dispersed within suitable inert organic solvents that do not react appreciably with any components incorporated therein.

Examples of useful inert organic solvents include but are not limited to, acetone, dichloromethane, isopropanol, Dowanol PM, ethylene glycol, 1-methoxy-2-propanol, 3-methyl-1-butanol, ethyl acetate, acetonitrile, benzonitrile, anisole, toluene, and mixtures thereof.

Use of Non-Aqueous Stannous Alkoxide Compositions

The non-aqueous stannous alkoxide compositions that are photocurable can be photocured or photopolymerized using suitable radiation as described above including ultraviolet light or visible actinic light, or both. One or more suitable light sources can be used for the exposure process. A precursor article prepared using the present invention can be exposed individually as a single element, or in alternative embodiments described below, as a web (for example, a roll-to-roll continuous web) of multiple precursor articles in multiple portions of a continuous web of substrate can be exposed as the web is passed through exposure stations, or as the exposure device is passed over the web. The same or different non-aqueous stannous alkoxide compositions can be applied (for example, printed) on one or both supporting sides (or surfaces) of the substrate whether it is in the form of a single element or continuous web. In many embodiments, different water-insoluble stannous alkoxide-containing patterns are formed on opposing supporting sides of the substrate (or continuous web).

For example, a non-aqueous stannous alkoxide composition (photocurable or non-photocurable) can be applied in a uniform or pattern-wise manner to any suitable substrate using any means for application, such as dip coating, roll coating, hopper coating, spray coating, spin coating, ink jetting, photolithographic imprinting, flexographic printing using relief printing members including flexographic printing members (such as flexographic printing plates and flexographic printing sleeves), lithographic printing using lithographic printing plates, and gravure or intaglio printing using appropriate printing members.

When the non-aqueous stannous alkoxide composition is photocurable and uniformly applied to a suitable substrate, it can be "imaged" or selectively exposed (or patterned) with exposing radiation through a suitable photomask (masking element) having the desired pattern, and then appropriately removing the non-crosslinked non-aqueous stannous alkoxide composition using a suitable "developer" solution. These features or steps can be carried out on both (opposing) supporting sides of the substrate.

Suitable substrates (also known as "receiver elements") can be composed of any suitable material as long as it will receive and does not inhibit the purpose of the non-aqueous stannous alkoxide composition. For example, substrates can be formed from materials including but not limited to, polymeric films, metallic films or electrically-conductive film supports, glasses (untreated or treated for example with tetrafluorocarbon plasma, hydrophobic fluorine, or a siloxane water-repellant material), silicon or ceramic wafers or other semi-conductive materials, fabrics, papers, and combinations thereof (such as laminates of various films, or laminates of papers and films), metallic films on electrically conductive film supports, semi-conducting organic or inorganic films, organic or inorganic dielectric films, or laminates of two or more layers of such materials provided that a uniform layer or pattern of a non-aqueous stannous alkoxide composition (that is photocurable) can be formed thereon in a suitable manner and followed by irradiation to form a uniform photocured layer or photocured stannous alkoxide-containing pattern on at least one supporting surface thereof. The substrate can be transparent or opaque, and rigid or flexible. The substrate can include one or more auxiliary polymeric or non-polymeric layers or one or more patterns of other materials before a pattern of non-aqueous stannous alkoxide composition is applied according to the present invention.

A main supporting surface of the substrate can be treated for example with a primer layer or electrical or mechanical treatments (such as graining) to render that surface a "receptive surface" to improve adhesion of a non-aqueous stannous alkoxide composition and resulting layer or pattern, or of a separate adhesive layer. An adhesive layer can be disposed on the substrate supporting surface and this adhesive layer can have various properties in response to stimuli (for example, it can be thermally activated, solvent activated, or chemically activated) and can serve as a receptive layer. Useful adhesive materials of this type are described for example in [0057] of U.S. Patent Application 2008/0233280 (Blanchet et al.).

In some embodiments, the substrate comprises a separate receptive layer as a receptive supporting surface disposed on a substrate, which receptive layer and substrate can be composed of a material such as a suitable polymeric material that is highly receptive of the non-aqueous stannous alkoxide composition. Such receptive layer can have a dry thickness of at least 0.05 µm and up to and including 10 µm, or typically of at least 0.05 µm and up to and including 3 µm, when measured at 25° C.

A supporting surface of the substrate, especially polymeric substrates, can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.).

Suitable substrate materials for forming articles of the present invention include but are not limited to, polymeric films such as poly(ethylene terephthalate) films, poly(ethylene naphthalate) films, polyimide films, polycarbonate films, polyacrylate films, polystyrene films, polyolefin films, and polyamide films, cellulosic papers or resin-coated or glass-coated papers. The substrate can also include one or more charge injection layers, charge transporting layers, and semi-conducting layers on which the non-aqueous stannous alkoxide-containing pattern is formed.

Particularly useful substrates are polyesters films such as poly(ethylene terephthalate), polycarbonate, or poly(vinylidene chloride) films with or without surface-treatments as noted above, or coatings.

Useful substrates can have a desired dry thickness depending upon the eventual use of the article formed therefrom, for example its incorporation into various articles or optical or display devices. For example, the substrate dry thickness (including all treatments and auxiliary layers) can be at least 0.001 mm and up to and including 10 mm, and especially for polymeric films, the substrate dry thickness can be at least 0.008 mm and up to and including 0.2 mm.

The substrate used to prepare the articles of this invention can be provided in various forms, such as for example, individual sheets in any size or shape, and continuous webs or rolls such as continuous webs or rolls of transparent substrates including those of transparent polyester substrates that are suitable for roll-to-roll operations. Such continuous webs or rolls can be divided or formed into individual first, second, and additional portions that can be used to form the same or different stannous alkoxide-containing patterns from the same or different non-aqueous stannous alkoxide compositions.

The non-aqueous stannous alkoxide composition can be subjected to an ultrasonication process if desired to increase the dispersibility of the various materials. After its application, any inert organic solvents can be removed by drying or pre-baking procedure that does not adversely affect the remaining materials or prematurely cause polymerization. Useful drying conditions can be as low as room temperature for as little as 5 seconds and up to and including several hours depending upon the manufacturing process. In most processes, such as roll-to-roll processes described below, the drying conditions can be at high enough temperatures to remove at least 90% of the inert organic solvent within at least 1 second.

Any applied uniform layer of a non-aqueous stannous alkoxide composition can have a dry thickness of at least 0.1 µm and up to and including 10 µm, or typically of at least 0.2 µm and up to and including 5 µm, and the optimal dry thickness can be tailored for the intended use of the resulting uniform layer. Such a uniform layer can be applied to both (opposing) supporting sides of the substrate, which uniform layers can have the same or different chemical compositions or dry thickness.

Any applied stannous alkoxide-containing pattern of a non-aqueous stannous alkoxide composition can comprise a grid of lines (or other shapes including circles or an irregular network) having an average thickness (or width) of at least 1 µm and up to and including 20 µm, or typically of at least 1 µm and up to and including 10 µm, and the optimal dry thickness (or width) can be tailored for the intended use of the resulting uniform layer (such as a photocured layer), which generally has about the same dry thickness (or width) as the grid lines of the non-photocured non-aqueous stannous alkoxide composition.

Thus, the present invention can be used to provide articles comprising a substrate and uniform layers of or water-insoluble stannous alkoxide-containing patterns formed from a non-aqueous stannous alkoxide composition described herein, wherein such articles can be considered "precursor" articles, meaning that they can be the first articles produced in methods used to provide electrically-conductive articles.

In some embodiments, the same or different non-aqueous stannous alkoxide composition can be applied in a suitable manner on both supporting sides (main surfaces) of the substrate to form "duplex" or dual-sided precursor articles, and each applied non-aqueous stannous alkoxide composition can be in the form of an uniform water-insoluble stannous alkoxide-containing layer or a water-insoluble stannous alkoxide-containing pattern.

In many embodiments, a pattern of a non-aqueous stannous alkoxide composition is applied onto one or both (opposing) supporting sides of the substrate (for example, that is provided as a roll-to-roll continuous web) using relief printing elements such as elastomeric relief elements derived from flexographic printing plate precursors, many of which are known in the art and some are commercially available, for example as the CYREL® Flexographic Photopolymer Plates from DuPont and the FLEXCEL™ SR and NX Flexographic plates from Eastman Kodak Company.

Thus, particularly useful elastomeric relief elements are derived from flexographic printing plate precursors and flexographic printing sleeve precursors, each of which can be appropriately imaged (and processed if needed) to provide a relief printing element for "printing" or applying a suitable non-aqueous stannous alkoxide composition to form a water-insoluble stannous alkoxide-containing pattern.

For example, useful elastomeric relief elements can be comprised of one or more elastomeric layers, with or without a substrate, in which a relief image can be generated using suitable imaging means.

A elastomeric relief element (for example, flexographic printing member) having a relief layer comprising an uppermost relief surface and a minimum relief image depth (pattern height) of at least 10 µm (or typically having a minimum relief image depth of at least 100 µm relative from the uppermost relief surface) can be prepared from image-wise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of which are incorporated herein by reference for details of such flexographic printing member precursors. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted Ali et al. patent. The relief layers can be different as different patterns of non-aqueous stannous alkoxide compositions are applied to opposing supporting sides of the substrate.

In other embodiments, the elastomeric relief element can be provided from a direct (or ablation) laser-engraveable elastomeric relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publications 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.), the disclosures of all of which are incorporated herein by reference.

As noted above, average relief image depth (relief pattern) or an average relief pattern height in the relief pattern is at least 10 µm or typically at least 50 µm relative to the uppermost relief surface. A maximum relief image depth (relief pattern) or relief pattern height can be as great as 1,000 µm, or typically up to and including 750 µm, relative to the uppermost relief surface. The relief pattern can have a shoulder angle of greater than 25° and up to and including 85° relative to a vertical line from the lowest recess to the uppermost relief surface as described in FIG. 4 of U.S. Pat. No. 7,799,504 (noted above).

When the noted elastomeric relief elements are used in the present invention, the non-aqueous stannous alkoxide composition can applied in a suitable manner to the uppermost relief surface (raised surface) in the elastomeric relief element. Application can be accomplished using several suitable means and it is desirable that as little as possible is coated onto the sides (slopes) or recesses of the relief depressions. Thus, it is desirable that as much as possible of the non-aqueous stannous alkoxide composition is applied only to the uppermost relief surface. Anilox roller systems or other roller application systems, especially low volume Anilox rollers, below 2.5 billion cubic micrometers per square inch (6.35 billion cubic micrometers per square centimeter) and associated skive knives can be used. Optimum metering of the non-aqueous stannous alkoxide composition onto the uppermost relief surface can be achieved by controlling viscosity or thickness, or choosing an appropriate application means.

For example, the non-aqueous stannous alkoxide composition can have a viscosity during this application of at least 1 cps (centipoise) and up to and including 1500 cps, or at least 1 cps to and up to and including 1500 cps. The thickness of the non-aqueous stannous alkoxide composition on the relief image is generally limited to a sufficient amount that can readily be transferred to a substrate but not too much to flow over the edges of the elastomeric relief element into the recesses during application.

The non-aqueous stannous alkoxide composition can be fed from an Anilox or other roller inking system in a measured amount for each printed precursor article. In one embodiment, a first roller can be used to transfer the non-aqueous stannous alkoxide composition from an "ink" pan or a metering system to a meter roller or Anilox roller. The non-aqueous stannous alkoxide composition is generally metered to a uniform thickness when it is transferred from the Anilox roller to a printing plate cylinder. When the substrate is moved through the roll-to-roll handling system from the printing plate cylinder to an impression cylinder, the impression cylinder applies pressure to the printing plate cylinder that transfers a printed image from an elastomeric relief element to the substrate.

After the non-aqueous stannous alkoxide composition has been applied to the uppermost relief surface (or raised surface) of the elastomeric relief element, it can be useful to remove at least 25 weight % of any inert organic solvents included in the non-aqueous composition to form a more viscous deposit on the uppermost relief surface of the relief image. This removal of inert organic solvents can be achieved in any manner, for example using jets of hot air, evaporation at room temperature, or heating in an oven at an elevated temperature, or other means known in the art for removing a solvent.

Once on the substrate, either as a uniform layer or predetermined pattern of grid lines or other shapes (on one or both opposing supporting sides of the substrate), the non-aqueous stannous alkoxide composition containing photocurable component (b) in the precursor article can be irradiated with suitable radiation as described above from a suitable source such as a fluorescent lamp or LED to provide a photocured layer or photocured pattern on the substrate. For example, photocuring or photopolymerization can be achieved by the use of UV-visible irradiation having a wavelength ($\lambda_{max}$) of at least 190 nm and up to and including 700 nm and at intensity of at least 1,000 microwatts/cm$^2$ and up to and including 80,000 microwatts/cm$^2$. The irradiation system used to generate such radiation can consist of one or more ultraviolet lamps for example in the form of 1 to 50 discharge lamps, for example, xenon, metallic halide, metallic arc (such as a low, medium or high pressure mercury vapor discharge lamps having the desired operating pressure from a few millimeters to about 10 atmospheres). The lamps can include envelopes capable of transmitting light of a wavelength of at least 190 nm and up to and including 700 nm or typically at least 240 nm and up to and including 450 nm. The lamp envelope can consist of quartz, such as SPECTROCIL™ or PYREX® materials. Typical lamps that can be employed for providing ultraviolet radiation are, for example, medium pressure mercury arcs, such as the GE H3T7 arc and a Hanovia 450 W arc lamp. Photopolymerization can be carried out using a combination of various lamps, some of or all of which can operate in an inert atmosphere. When using UV lamps, the irradiation flux impinging upon the substrate (or applied water-insoluble stannous alkoxide-containing layer or pattern) can be at least 0.01 watts/inch$^2$ (0.0197 watts/cm$^2$) to effect sufficient rapid photopolymerization and photocuring of the applied non-aqueous stannous alkoxide composition within 1 to 20 seconds in a continuous manner, for example in a continuous roll-to-roll operation.

An LED irradiation device to be used in the photocuring can have an emission peak wavelength of 350 nm or more. The LED device can include two or more types of elements having different emission peak wavelengths greater than or equal to 350 nm. A commercial example of an LED device that has an emission peak wavelength of 350 nm or more and has an ultraviolet light-emitting diode (UV-LED), is NCCU-033 that is available from Nichia Corporation.

In particularly useful precursor articles, when photocurable component (b) is present in the non-aqueous stannous alkoxide composition, the stannous alkoxide complex of component (a) can be covalently attached to a free radically photocurable material that can be the same as or different from a free radically photocurable material present in component (b).

In other embodiments of precursor articles, the non-aqueous composition comprises component (a) and non-photocurable water-insoluble polymer component (c) but no photocurable component (b). The applied non-aqueous stannous alkoxide composition is provided as a water-insoluble stannous alkoxide-containing pattern or uniform layer due to the presence of one or more non-curable, water-insoluble polymeric materials having a molecular weight of at least 10,000, as described above.

The result of irradiation of a precursor article (if photocurable component (b) is present) or the application of a non-aqueous stannous alkoxide composition without photocurable component (b) is an intermediate article comprising the substrate (for example, individual sheets or a continuous web) and having thereon either a layer or a pattern of a non-aqueous water-insoluble stannous alkoxide-containing composition on one or both supporting sides of the substrate, each of which is as described above.

The resulting intermediate articles are ready for use in some applications, but in most embodiments, they are further processed to incorporate an electrically-conductive metal on the uniform layer or pattern, each of which includes the water-insoluble stannous alkoxide complex for example by contact with an electroless plating solution.

For example, after contact of the pattern or uniform layer with reducible silver ions (as described below), an intermediate article is provided comprising electrically-conductive silver(0) particles as catalytic "seed" materials for further application of metals, for example using electroless metal plating procedures.

One useful method of this invention uses multiple flexographic printing plates (for example, prepared as described above) in a printing station wherein each stack of flexographic printing plates has its own printing plate cylinder so that each flexographic printing plate is used to print individual substrates, or the stack of printing plates can be used to print multiple portions in a single continuous web (on one or both opposing supporting sides). The same or different non-aqueous stannous alkoxide compositions can be "printed" or applied to a substrate (on same or opposing supporting sides) using the multiple flexographic printing plates.

In other embodiments, a central impression cylinder can be used with a single impression cylinder mounted on a printing press frame. As the substrate (or receiver element) enters the printing press frame, it is brought into contact with the impression cylinder and the appropriate water-insoluble stannous alkoxide-containing pattern is printed or formed with the non-aqueous stannous alkoxide composition. Alternatively, an "in-line" flexographic printing process can be utilized in which the printing stations are arranged in a horizontal line and are driven by a common line shaft. The printing stations can be coupled to exposure stations, cutting stations, folders, electroless plating baths, and any other useful continuous processing stations or equipment. A skilled worker could readily determine other useful configurations of equipment and stations using information that is available in the art. For example, an in-the-round imaging process is described in WO 2013/063084 (Jin et al.).

This intermediate article containing silver(0) seed metal particles on the surface of each water-insoluble stannous alkoxide-containing pattern can be immediately immersed in an aqueous-based electroless metal plating bath or solution, or the intermediate article can be stored with just the catalytic water-insoluble stannous alkoxide-containing pattern comprising silver(0) particles for use at a later time.

The intermediate article can be contacted with an electroless plating metal other than silver, to form an electrically-conductive pattern corresponding to the water-insoluble stannous alkoxide-containing pattern.

Any metal that will likely electrolessly "plate" on the silver(0) seed metal particles can be used at this point, but in most embodiments, the electroless plating metal can be for example copper(II), silver(I), gold(IV), palladium(II), platinum(II), nickel(II), chromium(II), and combinations thereof. Copper(II) and nickel(II) are particularly useful electroless plating metals.

The one or more electroless plating metals can be present in the aqueous-based electroless plating bath or solution in an amount of at least 0.01 weight % and up to and including 20 weight % based on total electroless plating solution weight. Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

One useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate, plating rate, and plating metal thickness.

Other useful aqueous-based electroless plating solutions or baths comprise copper(II) with EDTA and dimethylamineborane, copper(II) with citrate and hypophosphite, nickel (II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure to provide an electrically-conductive metal pattern on one or more portions of one or opposing supporting sides of the substrate, the resulting product article is removed from the aqueous-based electroless plating bath or solution and can again be washed using distilled water or deionized water or another aqueous-based solution to remove any residual electroless plating chemistry. At this point, the electrolessly plated metal is generally stable and can be used for its intended purpose.

In some embodiments, the resulting product article can be rinsed or cleaned with water at room temperature as described for example in [0048] of U.S. Patent Application Publication 2014/0071356 (noted above), or with deionized water at a temperature of less than 70° C. as described in [0027] of U.S. Patent Application Publication 2015/0125596 (noted above), the disclosures of both of which are incorporated herein by reference.

To change the surface of the electroless plated metal for visual or durability reasons, it is possible that a variety of post-treatments can be employed including surface plating of still at least another (at least a third) metal such as nickel or silver on the first electrolessly plated metal (this procedure is sometimes known as "capping"), or the creation of a metal oxide, metal sulfide, or a metal selenide layer that is adequate to change the surface color and scattering properties without reducing the electrical conductivity of the first electrolessly plated metal. Depending upon the metals used in the various capping procedures of the method, it may be desirable to treat the electrolessly plated metal with another suitable seed metal catalyst in an aqueous-based seed metal catalyst solution to facilitate deposition of additional electrically-conductive metals.

In addition, multiple treatments with an aqueous-based electroless metal plating solution can be carried out in sequence, using the same or different conditions. Sequential washing or rinsing steps can be also carried out where appropriate at room temperature or at a temperature less than 70° C.

Further, the electroless plating procedures can be carried out multiple times, in sequence, using the same or different electroless plating metal and the same or different electroless plating conditions.

Thus, in some embodiments of the method for providing a product article of this invention, the method comprises:

providing a continuous web of a transparent substrate of any of those materials described above, but particularly transparent polymeric substrates (such as polyesters films), forming a first water-insoluble stannous alkoxide-containing pattern from a water-insoluble stannous alkoxide composition as described herein, on at least a first portion of the continuous web using a non-aqueous stannous alkoxide composition as described above, for example using a flexographic printing member, if photocurable, exposing the first water-insoluble stannous alkoxide-containing pattern to radiation (as described above) to form a photocured first water-insoluble stannous alkoxide-containing pattern on the first portion, contacting the first water-insoluble stannous alkoxide-containing pattern on the first portion with reducible silver ions to chemically reduce the reducible silver ions and provide silver(0) particles on the surface of the first water-insoluble stannous alkoxide-containing pattern, and electrolessly plating the first water-insoluble stannous alkoxide-containing pattern on the first portion with an electrically conductive metal, using electroless plating procedures described above.

Embodiments of this method can be carried out on a single supporting side of the substrate, or on opposing supporting sides of the substrate to provide the same or different water-insoluble stannous alkoxide-containing patterns of electrically-conductive metals.

As would be apparent to one skilled in the art, a plurality of portions having the same or different water-insoluble stannous alkoxide-containing patterns can be provided on a continuous (for example, polyester) web (on one or both opposing supporting sides) according to the present invention.

For example, a method of this invention for providing a plurality of product articles comprises:

providing a continuous web of a transparent substrate (such as a continuous polyester roll-to-roll film), forming a water-insoluble stannous alkoxide-containing pattern on at least a first portion of the continuous web using a non-aqueous stannous alkoxide composition as described above, if photocurable, exposing the water-insoluble stannous alkoxide containing pattern to radiation (as described above) to form a photocured water-insoluble stannous alkoxide-containing pattern on the first portion, contacting the water-insoluble stannous alkoxide-containing pattern with reducible silver ions to provide silver(0) particles on the surface of the water-insoluble stannous alkoxide-containing pattern, electrolessly plating the water-insoluble stannous alkoxide-containing pattern on the first portion with an electrically conductive metal other than silver (as described above), and repeating the noted features on one or more additional portions of the continuous web that are different from the first portion, using the same or different non-aqueous stannous alkoxide composition.

In all of these methods, the stannous alkoxide complex generates silver nanoparticles from the reducible silver ions through chemical reactions wherein the stannous ions in the stannous alkoxide complex are oxidized and reduce the reducible silver ions.

This method can be used to similarly form electrically-conductive metal patterns on the opposing supporting sides of the substrate, especially when the substrate is a continuous web of material such as a polymeric web (for example a polyester web or continuous roll).

Alternatively, a method of this invention can be used to provide a plurality of precursor articles, the method comprising:

providing a continuous web of a transparent substrate (such as a continuous web of a transparent polyester) as described above, forming a first water-insoluble stannous alkoxide-containing pattern on a first portion of the continuous web by applying a non-aqueous stannous alkoxide composition to the first portion using a flexographic printing member as described above, advancing the continuous web comprising the first portion comprising the first water-insoluble stannous alkoxide-containing pattern to be proximate (sufficiently close to) exposing radiation if the first water-insoluble stannous alkoxide-containing pattern comprises photocurable component (b), and thereby forming a first photocured water-insoluble stannous alkoxide-containing pattern on the first portion, forming a second water-insoluble stannous alkoxide-containing pattern on a second portion of the continuous web by applying the same or different non-aqueous stannous alkoxide composition to the second portion using the same or different flexographic printing member, advancing the continuous web comprising the second portion comprising the second water-insoluble stannous alkoxide pattern to be proximate (sufficiently close to) exposing radiation if the second water-insoluble stannous alkoxide-containing pattern comprises photocurable component (b), and thereby forming a second photocured water-insoluble stannous alkoxide-containing pattern on the second portion, optionally, carrying out the above noted features one or more times on additional portions of the continuous web using the same or different non-aqueous stannous alkoxide compositions and the same or different flexographic printing member to form additional water-insoluble stannous alkoxide-containing patterns on the additional portions, and winding up the continuous web comprising multiple water-insoluble stannous alkoxide-containing patterns, or using the water-insoluble stannous alkoxide-containing pattern to form silver nanoparticles and patterns of electrolessly plated metal as described above.

As would be apparent from other teaching in this disclosure, such method embodiments can be carried out on opposing supporting sides of the continuous web to provide same or different water-insoluble stannous alkoxide-containing patterns on those opposing supporting sides.

In still other embodiments, a method of this invention can be used to provide a plurality of electrically-conductive metal patterns, and comprises:

providing a continuous web comprising multiple water-insoluble stannous alkoxide-containing patterns in respective portions, each water-insoluble stannous alkoxide-containing pattern being provided by irradiation of a photocurable non-aqueous stannous alkoxide composition as described above, treating the continuous web comprising multiple photocured water-insoluble stannous alkoxide-containing patterns with an electroless metal plating solution to provide multiple electrolessly plated metal patterns on the continuous web corresponding to the respective water-insoluble stannous alkoxide-containing portions, and optionally, further treating the multiple electrolessly plated metal patterns with a capping metal to provide multiple capped electrically conductive metal patterns on the continuous web.

This method can be taken further by:

forming individual electrically-conductive articles from the continuous web comprising multiple capped electrically-conductive patterns, and assembling the individual electrically-conductive articles into the same or different devices.

Such method embodiments can be carried out on both opposing supporting sides of the substrates using the same or different water-insoluble stannous alkoxide compositions.

Useful product articles prepared according to the present invention can be formulated into capacitive touch screen sensors that comprise suitable conductive grid lines, electrodes, electrical leads, and electrical connectors. For example, the electrodes and tail can be formed by multiple printings of the non-aqueous stannous alkoxide composition described herein and electrolessly plating the printed patterns. The electrodes can form an x-y grid that enables the recognition of the point at which the user has interacted with the sensor. For example, the grid can have 16×9 conductive lines or more and a size range of for example, from 2.5 mm by 2.5 mm to 2.1 m by 2.1 m. Top electrodes in the product article can correspond to the Y axis and can be provided on a first supporting side of the substrate and bottom electrodes are conductive lines corresponding to the X axis that can be provided on the opposing supporting side of the substrate.

Some details of useful methods and apparatus for carrying out the present invention are described for example in U.S. Patent Application Publications 2013/0071356 (Petcavich) and 2013/0125596 (Ramakrishnan et al.). Other details of a useful manufacturing system for preparing conductive articles especially in a roll-to-roll manner are provided in WO 2014/070131 (Petcavich et al.).

An additional system of equipment and step features that can be used in carrying out the present invention is described in U.S. Patent Application Publication. 2015/091006 (Shifley), the disclosure of which is incorporated herein by reference.

The present invention provides at least the following embodiments and combinations thereof, but other combinations of features are considered to be within the present invention as a skilled artisan would appreciate from the teaching of this disclosure:

1. A non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

2. A precursor article comprising a substrate and having disposed on at least one supporting surface thereof, a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

3. The precursor article of embodiment 2, wherein the non-aqueous stannous alkoxide composition is disposed on the at least one supporting surface of the substrate in a patternwise fashion.

4. An intermediate article comprising a substrate and having disposed on at least one supporting surface thereof, a water-insoluble photocured stannous alkoxide-containing pattern that was derived from photocuring a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

5. An intermediate article comprising a substrate and having disposed on at least one supporting surface thereof, a water-insoluble photocured pattern comprising silver (0) particles on the surface of a water-insoluble photocured stannous alkoxide-containing composition that was derived by photocuring a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photo sensitizer component (d) that is different from all of components (a) through (c), in an amount of at least 1 weight %, based on the total weight of the non-aqueous stannous alkoxide composition.

6. A product article comprising a substrate and having disposed on at least one supporting surface thereof, an electrically-conductive pattern comprising an electrically-conductive metal other than silver, which electrically-conductive pattern corresponds to and is electrically-plated over a water-insoluble photocured pattern comprising silver (0) particles on the surface of a water-insoluble stannous alkoxide-containing pattern that was derived by photocuring a non-aqueous stannous alkoxide composition that comprises the following components:

component (a) comprising a water-insoluble stannous alkoxide complex comprising stannous ions, which is present in an amount of at least 1 weight %, based on the total weight of the non-aqueous stannous alkoxide composition, and a photocurable component (b), non-photocurable water-insoluble polymer component (c) having a molecular weight of at least 10,000, or both the photocurable component (b) and the non-photocurable water-insoluble polymer component (c), wherein:

when photocurable component (b) is present, the non-aqueous stannous alkoxide composition further comprises photosensitizer component (d) that is different from all of components (a) through (c), in an amount of at least 1 weight %, based on the total weight of the non-aqueous stannous alkoxide composition.

7. Any of embodiments 1 to 6, wherein the water-insoluble stannous alkoxide complex is represented by the following Structure (I):

$$R_1O-Sn-OR_2 \quad (I)$$

wherein $R_1$ and $R_2$ are independently substituted or unsubstituted alkyl groups comprising 1 to 12 carbon atoms.

8. Any of embodiments 1 to 7, wherein the water-insoluble stannous alkoxide complex has a molecular weight of 3,000 or less.

9. Any of embodiments 1 to 8 wherein the water-insoluble stannous alkoxide complex is attached to a free radically photocurable material that is the same as or different from the photocurable component (b).

10. Any of embodiments 1 to 9, wherein the water-insoluble stannous alkoxide complex is present in an amount of at least 1 weight % and up to and including 30 weight %, based on the total weight of the non-aqueous stannous alkoxide composition.

11. Any of embodiments 1 to 10, wherein the photocurable component (b) comprises a photoinitiator in an amount of at least 3 weight %, based on the total weight of the non-aqueous stannous alkoxide composition.

12. Any of embodiments 1 to 11, wherein the non-aqueous stannous alkoxide composition further comprises an inert solvent.

13. Any of embodiments 1 to 11, wherein the non-aqueous stannous alkoxide composition comprises photocurable component (b) that also acts as an organic solvent for the water-insoluble stannous alkoxide composition and no inert organic solvents are purposely added to the water-insoluble stannous alkoxide composition.

14. Any of embodiments 1 to 13, wherein the non-aqueous stannous alkoxide composition further comprises one or more materials selected from the group consisting of: carbon black, graphite, graphene, carbon nanotubes, carbon-coated copper nanoparticles, and carbon-coated silver nanoparticles, each in an amount of at least 0.5 weight % based on the total weight of the water-insoluble stannous alkoxide composition.

The following Examples are provided to illustrate the practice of this invention and are not meant to be limiting in any manner.

The following examples demonstrate that stannous alkoxide complexes as described above are useful in non-aqueous stannous alkoxide compositions for surface generation of catalytic "seed" silver particles from reducible silver ions. The in-situ generated silver particles are very effective for this purpose in electroless metal plating operations, for example the electroless plating of copper to provide electrically-conductive articles.

Inventive Example 1

Preparation of Water-Insoluble
Sn(1-methoxy-2-propanol)$_2$ Complex

Stannous chloride (0.5 g, 2.6 mmol) was dissolved in 1-methoxy-2-propanol (10 g, excess) with heat under nitrogen and refluxed for 1 hour. Non-complexed alcohol was removed under reduced pressure and elevated temperature to form the desired water-insoluble stannous alkoxide complex.

Preparation of Non-Aqueous
Sn(1-methoxy-2-propanol)$_2$ Composition

A mixture of 1,1,1-trimethylolpropane triacrylate (SR351, Sartomer), ethoxylated (30) bisphenol A dimethacrylate (SR 9036A, Sartomer), poly(methyl methacrylate), and a solution of photoinitiator and photoreducing composition phenylbis(2,4,6-trimethylbenzoyl) phosphine oxide was prepared in 1-methoxy-2-propanol. To this mixture, the Sn(1-methoxy-2-propanol)$_2$ complex described above was added and dissolved by stirring in the dark to form a non-aqueous stannous alkoxide composition according to the present invention. After mixing all of the components, the final amounts of components in the composition were as follows:

| Component | Weight % |
| --- | --- |
| Sn(1-methoxy-2-propanol)$_2$ Complex | 4.78 |
| Ethoxylated (30) bisphenol A dimethacrylate SR 9036A | 22.3 |

-continued

| Component | Weight % |
| --- | --- |
| Poly(methyl methacrylate), Mol. Wt. 15,000 | 14.4 |
| 1,1,1-Trimethylolpropane triacrylate SR351 | 11.2 |
| Phenylbis(2,4,6-trimethylbenzoyl) phosphine oxide | 3.82 |
| 1-Methoxy-2-propanol | 31.1 |
| Benzonitrile | 12.4 |

Printing and Chemical Generation of Silver Nanoparticles in an Article:

A water-insoluble stannous alkoxide-containing pattern of fine lines of nominal width 7-10 µm of the non-aqueous stannous alkoxide composition described above was printed onto a poly(ethylene terephthalate) film substrate using a flexographic test printer IGT F1 and flexographic printing members obtained from commercially available Kodak Flexcel NX photopolymer plates that had been imaged using a mask that was written using the Kodak Square Spot laser technology at a resolution of 12,800 dpi.

The resulting printed precursor article was exposed to UV light using Fusion benchtop conveyor unit equipped with H-bulb as a nominal UV dose of between 50-100 mJ/cm$^2$ to provide an intermediate article having a photocured water-insoluble stannous alkoxide-containing pattern of fine lines comprising the non-aqueous stannous alkoxide complex.

Electroless Copper Plating:

The intermediate article described above was first immersed in a bath containing dissolved silver nitrate ($10^{-1}$ molar to $10^{-3}$ molar, 2-10 seconds) to provide silver nanoparticles in the photocured fine lines, followed by a water rinse and final immersion in an electroless copper plating bath solution obtained from ENTHONE® (Enplate LDS CU-406 SC) at 40° C. for 10 minutes using conditions recommended by the commercial supplier. The resulting product article having electrically-conductive fine lines was taken out of the bath, rinsed with water, and dried. Fine lines of metallic copper were observed on the surface of this product article and its surface resistivity was measured to be about 4 ohms/square or less. The average thickness of plated copper in the fine lines was measured by X-ray fluorescence to be about 1 µm.

Invention Example 2

Preparation of Water-Insoluble
Sn(3-methyl-1-butanol)$_2$ Complex

Stannous chloride (0.5 g, 2.6 mmol) was dissolved in 3-methyl-1-butanol (5 g, excess) with heat under nitrogen and refluxed for 1-2 hour(s). Non-complexed alcohol was removed under reduced pressure and elevated temperature to form the desired water-insoluble stannous alkoxide complex.

Preparation of Non-Aqueous
Sn(3-methyl-1-butanol)$_2$ Composition

A mixture of 1,1,1-trimethylolpropane triacrylate (SR351, Sartomer) and ethoxylated (30) bisphenol A dimethacrylate (SR 9036A, Sartomer) and poly(methyl methacrylate) and a solution of photoinitiator and photoreducing composition phenylbis(2,4,6-trimethylbenzoyl) phosphine oxide was prepared in 1-methoxy-2-propanol. To this mixture, the Sn(3-methyl-1-butanol)$_n$ complex described above was added and dissolved by stirring in the dark to form a non-aqueous stannous alkoxide composition according to the present invention. After mixing all of the components, the final component amounts were as follows:

| Component | Weight % |
| --- | --- |
| Sn(3-methyl-1-butanol)$_2$ Complex | 4.78 |
| Ethoxylated (30) bisphenol A dimethacrylate SR 9036A | 22.3 |
| Poly(methyl methacrylate), Mol. Wt. 15,000 | 14.4 |
| 1,1,1-Trimethylolpropane triacrylate SR351 | 11.2 |
| Phenylbis(2,4,6-trimethylbenzoyl) phosphine oxide | 3.82 |
| 1-Methoxy-2-propanol | 21.5 |
| Benzonitrile | 22.0 |

Printing and Chemical Generation of Silver Particles in an Article:

A water-soluble stannous alkoxide-containing pattern of fine lines of nominal width 7-10 μm of the non-aqueous stannous alkoxide composition described example above was printed onto a poly(ethylene terephthalate) film substrate using a flexographic test printer IGT F1 and flexographic printing members obtained from commercially available Kodak Flexcel NX photopolymer plates that has been imaged using a mask that was written using the Kodak Square Spot laser technology at a resolution of 12,800 dpi.

The resulting printed precursor article was exposed to UV light using Fusion benchtop conveyor unit equipped with H-bulb as a nominal UV dose of between 50-100 mJ/cm$^2$ to provide an intermediate article having a photocured water-insoluble stannous alkoxide-containing pattern of fine lines comprising the water-soluble stannous alkoxide complex.

Electroless Copper Plating:

The intermediate article described above was first immersed in a bath containing dissolved silver nitrate ($10^{-1}$ molar to $10^{-3}$ molar, 2-10 seconds) to form silver nanoparticles in the fine lines with the stannous alkoxide complex, followed by a water rinse and a final immersion in an electroless copper plating bath solution obtained from ENTHONE® (Enplate LDS CU-406 SC) at 40° C. for 10 minutes using conditions recommended by the commercial supplier. The resulting product article was taken out of the bath, rinsed with water, and dried. Fine lines of metallic copper were observed on the surface of the product article and its surface resistivity was measured to be about 0.1 ohms/square. The average thickness of plated copper in the fine lines was measured by X-ray fluorescence to be about 1 μm.

Invention Example 3

Preparation of Water-Insoluble Sn(1-phenylmethanol)$_2$ Complex

Stannous chloride (0.5 g, 2.6 mmol) was dissolved in benzyl alcohol (5 g, excess) with heat under nitrogen and refluxed for 1-2 hour(s). Non-complexed alcohol was removed under reduced pressure and elevated temperature to form the desired water-insoluble stannous alkoxide complex.

Preparation of Non-Aqueous Sn(3-methyl-1-butanol)$_2$ Composition

A mixture of 1,1,1-trimethylolpropane triacrylate (SR351, Sartomer) and ethoxylated (30) bisphenol A dimethacrylate (SR 9036A, Sartomer) and poly(methyl methacrylate) and a solution of photoinitiator and photoreducing composition phenylbis(2,4,6-trimethylbenzoyl) phosphine oxide was prepared in 1-methoxy-2-propanol. To this mixture, the Sn(1-phenylmethanol)$_2$ complex described above was added and dissolved by stirring in the dark to form a non-aqueous stannous alkoxide composition according to the present invention. After mixing all of the components, the final component amounts were as follows:

| Component | Weight % |
| --- | --- |
| Sn(3-methyl-1-butanol)$_2$ Complex | 5.58 |
| Ethoxylated (30) bisphenol A dimethacrylate SR 9036A | 26.0 |
| Poly(methyl methacrylate), Mol. Wt. 15,000 | 16.7 |
| 1,1,1-Trimethylolpropane triacrylate SR351 | 13.0 |
| Phenylbis(2,4,6-trimethylbenzoyl) phosphine oxide | 4.51 |
| 1-Methoxy-2-propanol | 25.1 |
| Benzonitrile | 9.02 |

Printing and Chemical Generation of Silver Particles in an Article:

A water-soluble stannous alkoxide-containing pattern of fine lines of nominal width 7-10 μm of the non-aqueous stannous alkoxide composition described example above was printed onto a poly(ethylene terephthalate) film substrate using a flexographic test printer IGT F1 and flexographic printing members obtained from commercially available Kodak Flexcel NX photopolymer plates that has been imaged using a mask that was written using the Kodak Square Spot laser technology at a resolution of 12,800 dpi.

The resulting printed precursor article was exposed to UV light using Fusion benchtop conveyor unit equipped with H-bulb as a nominal UV dose of between 50-100 mJ/cm$^2$ to provide an intermediate article having a photocured water-insoluble stannous alkoxide-containing pattern of fine lines comprising the water-soluble stannous alkoxide complex.

Electroless Copper Plating:

The intermediate article described above was first immersed in a bath containing dissolved silver nitrate ($10^{-1}$ molar to $10^{-3}$ molar, 2-10 seconds) to form silver nanoparticles in the fine lines with the stannous alkoxide complex, followed by a water rinse and a final immersion in an electroless copper plating bath solution obtained from ENTHONE® (Enplate LDS CU-406 SC) at 40° C. for 10 minutes using conditions recommended by the commercial supplier. The resulting product article was taken out of the bath, rinsed with water, and dried. Fine lines of metallic copper were observed on the surface of the product article and its surface resistivity was measured to be 0.1 ohms/square. The average thickness of plated copper in the fine lines was measured by X-ray fluorescence to be about 1 μm.

The invention has been described in detail with particular reference to certain preferred embodiments thereof, but it will be understood that variations and modifications can be effected within the spirit and scope of the invention.

The invention claimed is:

1. A non-aqueous stannous alkoxide composition comprising:
   component (a) comprising a water-insoluble stannous alkoxide complex comprising stannous ions, which is present in an amount of at least 1 weight %, based on the total weight of the non-aqueous stannous alkoxide composition, and
   a photocurable component (b) including a free radical photoinitiator, or both the photocurable component (b) including the free radical photoinitiator, and a non-photocurable water-insoluble polymer component (c)

having a molecular weight of at least 10,000, wherein the non-aqueous stannous alkoxide composition further comprises photosensitizer component (d) that is different from all of components (a) through (c), in an amount of at least 1 weight %, based on the total weight of the non-aqueous stannous alkoxide composition.

2. The non-aqueous stannous alkoxide composition of claim 1, wherein the water-insoluble stannous alkoxide complex is represented by the following Structure (I):

R₁O—Sn—OR₂          (I)

wherein $R_1$ and $R_2$ are independently substituted or unsubstituted alkyl groups comprising 1 to 12 carbon atoms.

3. The non-aqueous stannous alkoxide composition of claim 1, wherein the water-insoluble stannous alkoxide complex has a molecular weight of 3,000 or less.

4. The non-aqueous stannous alkoxide composition of claim 1 wherein the water-insoluble stannous alkoxide complex is attached to a free radically photocurable material that is the same as or different from the photocurable component (b).

5. The non-aqueous stannous alkoxide composition of claim 1, wherein the water-insoluble stannous alkoxide complex is present in an amount of at least 1 weight % and up to and including 30 weight %, based on the total weight of the non-aqueous stannous alkoxide composition.

6. The non-aqueous stannous alkoxide composition of claim 1, wherein the photocurable component (b) includes the free radical photoinitiator in an amount of at least 0.1 weight % and up to and including 10 weight %, based on the total weight of the non-aqueous stannous alkoxide composition.

7. The non-aqueous stannous alkoxide composition of claim 1, further comprises an inert solvent.

8. The non-aqueous stannous alkoxide composition of claim 1, comprising photocurable component (b) that also acts as an organic solvent for the water-insoluble stannous alkoxide composition and no inert organic solvents are purposely added to the water-insoluble stannous alkoxide composition.

9. The non-aqueous stannous alkoxide composition of claim 1, further comprising one or more materials selected from the group consisting of: carbon black, graphite, graphene, carbon nanotubes, carbon-coated copper nanoparticles, and carbon-coated silver nanoparticles, each in an amount of at least 0.5 weight % based on the total weight of the water-insoluble stannous alkoxide composition.

10. A precursor article comprising a substrate and having disposed on at least one supporting surface thereof, a non-aqueous stannous alkoxide composition comprising:

component (a) comprising a water-insoluble stannous alkoxide complex comprising stannous ions, which is present in an amount of at least 1 weight %, based on the total weight of the non-aqueous stannous alkoxide composition, and a photocurable component (b) including a free radical photoinitiator or both the photocurable component (b) including the free radical photoinitiator, and a non-photocurable water-insoluble polymer component (c) having a molecular weight of at least 10,000, wherein the non-aqueous stannous alkoxide composition further comprises photosensitizer component (d) that is different from all of components (a) through (c), in an amount of at least 1 weight %, based on the total weight of the non-aqueous stannous alkoxide composition.

11. The precursor article of claim 10, wherein the non-aqueous stannous alkoxide composition is disposed on the at least one supporting surface of the substrate in a patternwise fashion.

* * * * *